United States Patent [19]
Goell et al.

[11] 4,065,203
[45] Dec. 27, 1977

[54] COUPLERS FOR ELECTRO-OPTICAL ELEMENTS

[75] Inventors: James E. Goell, Roanoke, Va.; H. David Brandt, S. Hamilton, Mass.

[73] Assignee: International Telephone and Telegraph Corporation, Nutley, N.J.

[21] Appl. No.: 639,546

[22] Filed: Dec. 10, 1975

[51] Int. Cl.² .................................................. G02B 5/14
[52] U.S. Cl. ................................................... 350/96 C
[58] Field of Search ...................... 350/96 C, 96 WG; 250/227, 552

[56] References Cited

U.S. PATENT DOCUMENTS

| | | | |
|---|---|---|---|
| 3,541,341 | 11/1970 | Lecte | 250/227 |
| 3,628,036 | 12/1971 | Humphrey | 350/96 C X |
| 3,666,949 | 5/1972 | De Falco et al. | 250/227 |
| 3,790,791 | 2/1974 | Anderson | 250/227 |
| 3,800,388 | 4/1974 | Borner et al. | 350/96 C X |
| 3,808,549 | 4/1974 | Maurer | 350/96 WG |
| 3,932,761 | 1/1976 | Ramsey et al. | 350/96 C X |
| 3,948,582 | 4/1976 | Martin | 350/96 C |

OTHER PUBLICATIONS

Boivin, L. P., "Thin-Film Laser-to-Fiber Coupler" Applied Optics vol. 13, No. 2 Feb. 1974, pp. 391–395.

*Primary Examiner*—John K. Corbin
*Assistant Examiner*—Rolf Hille
*Attorney, Agent, or Firm*—John T. O'Halloran; Peter C. Van Der Sluys

[57] ABSTRACT

Rapid interconnection between electro-optical elements and optical fibers is provided by a two-piece coupler. One element consists of a light conducting fiber within a rigid support tube which is secured both to the electro-optical element support and to the electro-optical element cap. The other element consists of a dual diameter connector tube which fits over the support tube at one end and accommodates an optical fiber at the other end. Insertion of the optical fiber within the connector tube provides close optical coupling between the electro-optical element and the optical fiber by means of the light conducting fiber within the support tube.

20 Claims, 8 Drawing Figures

COUPLERS FOR ELECTRO-OPTICAL ELEMENTS

BACKGROUND OF THE INVENTION

Optical connection between optical fibers and electro-optical elements generally is provided by cementing one end of the optical fiber to the electro-optical element by means of a transparent adhesive. Since maximum light transmission is desired between the fiber's optical source and the fiber's light detector, apparatus is generally employed to insure proper alignment and to promote minimum losses to the system. When an epoxy-type cement is employed to join the optical fiber to the electro-optical element some time is required to allow the epoxy to cure and become set. Particular care must be taken during the curing process to insure that the element and fiber do not move out of optical alignment.

Another problem with the method of connecting between electro-optical elements and optical fibers by cementing the fiber end to the electro-optical element is the extreme fragility imparted to the fiber because of the small dimensions and long lengths of fibers usually involved.

When light emitting diodes are employed as optical emitters in light communication systems, and are connected directly to optical communications fibers by means of a clear epoxy cement, there is a possibility that the epoxy material will react with the diode structure to result in premature diode failure. It is generally desired, therefore, to provide optical connection between the fiber and the electro-optical element without the use of an adhesive material.

The purpose of this invention, therefore, is to provide for good optical connection between electro-optical elements and optical fibers without cementing the fibers directly to the electro-optical elements.

SUMMARY OF THE INVENTION

A coupler is provided for connecting between optical fibers and electro-optical elements without the need for cementing the fiber to the element. The coupler consists of a support element enclosing a light transmissive fiber cemented in close proximity to the element without contact. A connector element provides removable connection between the support element and an optical fiber by coupling the connector element to the support element and inserting the optical fiber within the connector element.

In one embodiment of the invention the electro-optical element comprises a stripe light emitting diode.

DESCRIPTION OF THE PREFERRED EMBODIMENTS

Figure 1A:
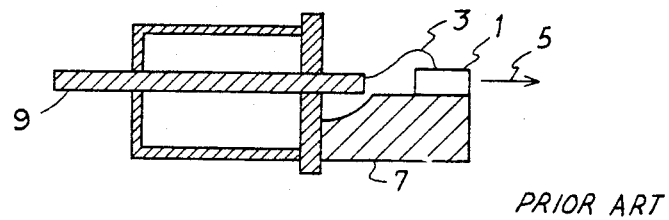
FIG. 1A is a cross-sectional view of an electro-optical element mounted on a prior art support structure.
Figure 1B:
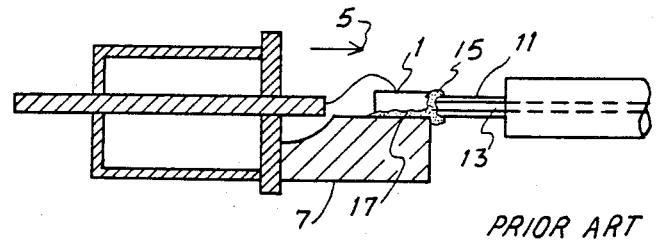
FIG. 1B is a cross-sectional view of an optical fiber cemented to the electro-optical element of FIG. 1A.

One application for the coupler of this invention can be seen by referring to FIG. 1A. A light emitting diode 1 of the type having a stripe light source emitting in the direction indicated by arrow 5 is shown fixedly attached to a header 7. Electrical connection is made with the diode 1 by means of lead 3 extending from the diode 1 and connecting with electrical contact stud 9. Electrical connection is also provided to the diode by means of the header 7. When the diode 1 is used within a prior art electrical communications system a systems fiber 11 as shown in FIG. 1B (or an intermediate fiber) is cemented to the diode 1. The fiber 11 is usually cemented to the light emitting surface of diode 1 by means of an epoxy interface 15 so that the light travels from the diode 1 through the epoxy 15 into the fiber core 13 as indicated by directional arrow 5. The diode 1 is fixedly attached to the header 7 usually by means of a low temperature metal solder 17. When the systems fiber 11 is to be connected to a light detecting device attachment to the light detection device is made by cementing the fiber core to the light detection device in a similar manner as indicated for the diode 1 of FIG. 1B.

A multi-functional electro-optical coupler is described within copending Application Ser. No. 639,544, filed 12/10/75, assigned to the common assignee of the instant invention. The aforementioned electro-optical coupler incorporated herein by way of reference discloses methods and means for interchangeably coupling with systems fibers and electro-optical elements. The instant invention improves over the coupler described within the aforementioned application since some type of optical fiber must be fixedly cemented to the electro-optical element as described within the prior art device of FIG. 1B above.

Figure 2A:
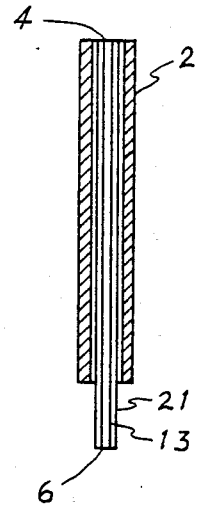
FIG. 2A is a side sectional view of a support tube and light conducting fiber according to this invention.
Figure 2B:
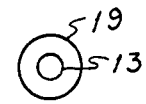
FIG. 2B is a cross-sectional view of the optical fiber of FIG. 1B.

One element of the instant invention can be seen by referring to FIG. 2A where a connector fiber 21 consisting of glass or plastic is inserted within a support tube 2 which can be composed of various materials depending upon the material used for connector fiber 21. The connector fiber 21 is generally optically polished at the electro-optical element end 6 and at the systems fiber connection end 4 in order to promote good optical continuity at both ends. The systems fiber 11 as shown in FIG. 2B generally consists of a light transmissive core region 13 having a relatively high index of refraction and a cladding 19 of lower index of refraction than core 13. The purpose of the support tube 2 of the coupler of this invention is to provide structural support to the connector fiber 21 which is generally bonded or cemented within the support tube 2. The support tube 2 in turn is usually fixedly attached to the electro-optical cap element in order to provide a support base for the support tube 2.

Figure 3A:
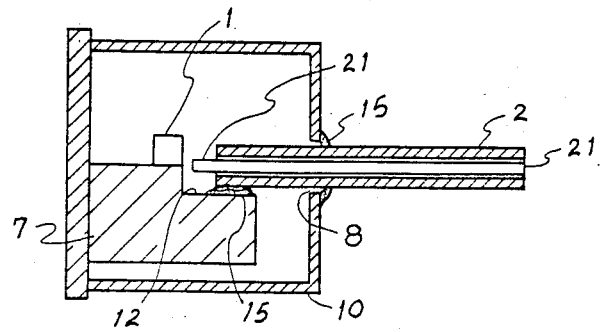
FIG. 3A is a side sectional view of the support tube of FIG. 2A connected to the header of an electro-optical element according to this invention.

FIG. 3A shows the support tube 2 extending through an aperture 8 in a diode cap 10. The support tube 2 can be cemented to the diode cap 10 by means of a small amount of epoxy cement 15. In order to provide further support to the connector fiber 21, support tube 2 is cemented to the header 7. Efficient light transfer between the light emitting diode 1 and the connector fiber 21 can be accomplished by attaching a light detection device to one end of the connector fiber 21 and moving the connector fiber 21 relative to the light emitting diode 1 until an optimum response is reached. The support tube 2 is then cemented to the header 7 by means of a step 12 by the application of a small amount of epoxy 15, taking particular care not to move the support tube 2 relative to the diode 1 until the epoxy 15 cures. Further support to the support tube 2 can be provided by cementing the diode cap in turn to the header 7.

Figure 3B:
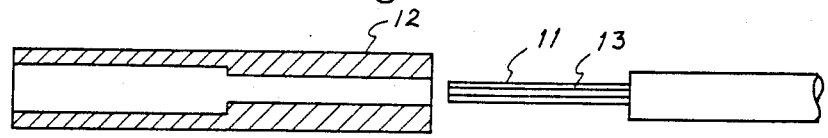
FIG. 3B is a side sectional view of an optical fiber and connector tube according to this invention.

After fixedly attaching the support tube 2 to the header 7 and the diode cap 10 the first element of the coupler of this invention is complete. The second element consists of a connector tube 12 as shown in FIG. 3B. The connector tube 12 for the purpose of this embodiment is described as consisting of metal, however, other materials may be used depending upon the optical properties of the support tube 2 and connector fiber 21. Connector tube 12 has an inner diameter chosen to provide a close fit between the support tube 2 at one end and the core 13 of a systems fiber 11 at the other end. When the internal diameter of the connector tube at one end is carefully machined for clearance over the external diameter of support tube 2, the connector tube 12 slidingly encompasses the support tube 2 and is supported thereon. When the internal diameter of the connector tube 12 at the end which receives the fiber 11 is carefully machined to provide clearance when the fiber 11 is inserted therein, the systems fiber 11 can be supported within the connector tube 12 without the necessity of auxiliary support mechanisms.

Figure 3C:
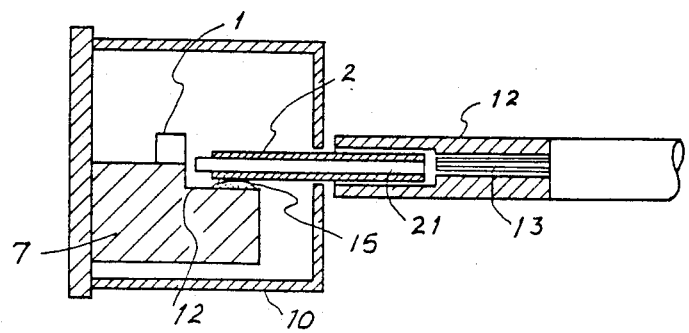
FIG. 3C is a side sectional view of an optical fiber within a connected coupler according to this invention.

FIG. 3C shows the complete electro-optical coupler of this invention where the second element consisting of connector tube 12 slidingly engages the support tube 2 and the systems fiber 11 is inserted within the connector tube 12. Good optical continuity is provided between the systems fiber 11 and the connector fiber 21 by means of the core 13 by the axial alignment provided within connector tube 12.

Figure 3D:
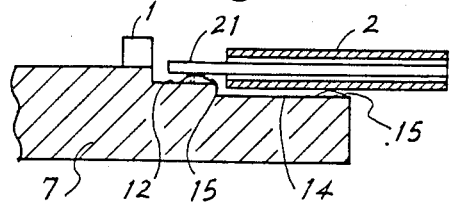
FIG. 3D is an enlarged side sectional view of an alternate embodiment of the support tube and header arrangement of FIG. 3A.

An alternate embodiment of the coupler of this invention is provided by the second step 14 located on the header 7 as shown in FIG. 3D. In this embodiment the support tube 2 is supported by the second step 14 and a small amount of epoxy 15 is applied to secure the support tube in place. The first step 12 now provides support for the connector fiber 21 and optimum optical transfer from the light emitting diode 1 to the connector fiber 21 is insured by the use of optical detection instrumentation as described earlier.

Interchangeability is provided by the electro-optical coupler of this invention as seen by referring to FIG. 3C. Here systems fiber 11 can be quickly and conveniently removed from the coupler by merely pulling the core 13 out of connector tube 12. Other systems fibers can be inserted within connector tube 12 to provide optical continuity with light emitting diode 1 as desired. In the event that connector fiber end 4 as shown in FIG. 2B becomes covered with foreign material such as dust or metal filings access can be readily provided to the fiber end 4 for cleaning and repolishing, if necessary. This can be seen by referring to FIG. 3C where the systems fiber and connector tube can be gently pulled from the support tube 2 to expose connector fiber 21 for polishing and repair without in any way interfering with the optical alignment provided between connector fiber 21 and light emitting diode 1.

Other electro-optical elements can be used within the coupler of this invention as desired. Light emitting diode 1 can be replaced by a light responsive element such as a PIN diode when optical detection rather than light emission is desired. Further various materials can be chosen for the connector fiber 21 and support tube 2 depending upon the optical properties desired. When connector fiber 21 consists of a silica rod then support tube 2 could consist of or contain a plastic or glass material having a lower refractive index than silica in order to promote total internal reflection within the silica rod. The connector tube 12 can also consist of a low refractive index plastic or glass material in order to provide total internal reflection between the core 13 of the systems fiber 11 and to insure that light will not exit through support tube 2.

When the electro-optical coupler of FIG. 3C is used in an optical communications system and light emitting diode 1 should fail rapid and immediate replacement can be afforded by means of an auxiliary light emitting diode already positioned within its own support and cap. Interconnection is quickly made by removing connector tube 12 with systems fiber 11 still attached and by connecting connector tube 12 with the support tube of the replacement diode.

When the electro-optical coupler of this invention is used extended diode life is anticipated since no epoxy or other adhesive material contacts the electro-optical element. This is important since the diode can possibly deteriorate due to the contact with adhesives.

Although the electro-optical coupler of this invention is disclosed for application within optical communication systems, this is not intended as a limitation in scope. The electro-optical coupler of this invention finds application wherever removable connection between electro-optical elements and optical fibers may be desired.

What is claimed is:

1. A coupler for connecting between optical fibers and electro-optical elements of the type having a supporting header comprising:
    first coupling means for providing optical connection with said electro-optical elements a connector optical fiber within a support tube fixedly attached to the header; and
    second coupling means for connecting between said optical fibers and said electro-optical elements when said fibers are connected with said second coupling means and said second coupling means are connected with said first coupling means, said second coupling means comprising a dual diameter tube for receiving the support tube at one end and at least one optical fiber at the other end for providing optical continuity between said at least one electro-optical element and said at least one optical fiber.

2. The coupler of claim 1 wherein the header includes a step portion of at least one surface thereof.

3. The coupler of claim 2 wherein said support tube is fixedly attached to said step portion.

4. The coupler of claim 1 wherein said first coupling means further includes a cap element.

5. The coupler of claim 4 wherein said cap element contains an aperture on one surface thereof.

6. The coupler of claim 5 wherein said cap element is fixedly secured at an opposite end to said header.

7. The coupler of claim 6 wherein said support tube extends through said aperture and is fixedly attached to said cap element.

8. The coupler of claim 1 wherein said connector fiber is optically polised at both ends to provide good optical transmission in and out of said fiber.

9. The coupler of claim 1 wherein said electro-optical elements comprise at least one light emitting diode.

10. The coupler of claim 9 wherein said light emitting diode is a stripe source light emitting diode.

11. The coupler of claim 10 wherein said stripe source light emitting diode comprises a laser.

12. The coupler of claim 1 wherein said electro-optical elements comprise at least one light detector.

13. The coupler of claim 12 wherein said light detector comprises a photoresponsive diode.

14. The coupler of claim 2 wherein said header includes a second step portion wherein said support tube is supported on said second step portion and said connector fiber is supported on said step portion.

15. The coupler of claim 2 wherein said connector fiber comprises silica and said support tube comprises plastic whereby said plastic support tube has a lower index of refraction than said silica to promote internal reflection within said fiber.

16. The coupler of claim 1 wherein said dual diameter tube comprises a plastic.

17. The coupler of claim 1 wherein said plastic dual diameter tube has a lower index of refraction than said silica core to provide total internal reflection within said tube.

18. the coupler of claim 1 wherein said support tube and said dual diameter tube are composed of metal.

19. The coupler of claim 1 wherein said support tube and said dual diameter tube are composed of glass.

20. The coupler of claim 1 wherein the core of the coupling fiber is of diameter intermediate to the diameter of the core of the systems fiber and the active area of the optical element.

* * * * *